(12) United States Patent
Tischler et al.

(10) Patent No.: US 7,332,031 B2
(45) Date of Patent: *Feb. 19, 2008

(54) BULK SINGLE CRYSTAL GALLIUM NITRIDE AND METHOD OF MAKING SAME

(75) Inventors: Michael A. Tischler, Phoenix, AZ (US); Thomas F. Kuech, Madison, WI (US); Robert P. Vaudo, New Milford, CT (US)

(73) Assignee: Cree, Inc., Durham, NC (US)

( * ) Notice: Subject to any disclaimer, the term of this patent is extended or adjusted under 35 U.S.C. 154(b) by 178 days.

This patent is subject to a terminal disclaimer.

(21) Appl. No.: 11/243,768

(22) Filed: Oct. 5, 2005

(65) Prior Publication Data

US 2006/0032432 A1 Feb. 16, 2006

Related U.S. Application Data

(63) Continuation of application No. 09/929,789, filed on Aug. 14, 2001, now Pat. No. 6,972,051, which is a continuation of application No. 08/955,168, filed on Oct. 21, 1997, now abandoned, which is a continuation-in-part of application No. 08/188,469, filed on Jan. 27, 1994, now Pat. No. 5,679,152.

(51) Int. Cl.
*C30B 25/00* (2006.01)

(52) U.S. Cl. .............................. 117/97; 117/84; 117/88; 117/915; 117/952

(58) Field of Classification Search ................ 117/84, 117/88, 97, 915, 952
See application file for complete search history.

(56) References Cited

U.S. PATENT DOCUMENTS 851,134 A 4/1907 Kleidon 1,616,777 A 2/1927 Booth (Continued)

FOREIGN PATENT DOCUMENTS

DE 224341 A1 7/1985

(Continued)

OTHER PUBLICATIONS

Akinaga, H., et al., Growth and characterization of low-temperature grown GaN with high Fe doping, Applied Phys. Lett. 2000, pp. 4377-4379, vol. 77, No. 26.

(Continued)

*Primary Examiner*—Yogendra N. Gupta
*Assistant Examiner*—Matthew J. Song
(74) *Attorney, Agent, or Firm*—Vincent K. Gustafson; Intellectual Property/Technology Law; Julio Garceran

(57) ABSTRACT

A single crystal M*N article, which may be made by a process including the steps of: providing a substrate of material having a crystalline surface which is epitaxially compatible with M*N; depositing a layer of single crystal M*N over the surface of the substrate; and removing the substrate from the layer of single crystal M*N, e.g., with an etching agent which is applied to the substrate to remove same, to yield the layer of single crystal M*N as said single crystal M*N article. The bulk single crystal M*N article is suitable for use as a substrate for the fabrication of microelectronic structures thereon, to produce microelectronic devices comprising bulk single crystal M*N substrates, or precursor structures thereof.

34 Claims, 2 Drawing Sheets

U.S. PATENT DOCUMENTS

| | | | |
|---|---|---|---|
| 2,554,546 A | 5/1951 | Zahm | |
| 3,326,820 A | 6/1967 | Cuomo et al. | |
| 3,550,177 A | 12/1970 | Darr et al. | |
| 3,598,526 A | 8/1971 | Huml et al. | |
| 3,607,014 A | 9/1971 | Huml et al. | |
| 3,634,149 A | 1/1972 | Knippenberg | |
| 3,806,777 A | 4/1974 | Edmonds | |
| 3,829,556 A | 8/1974 | Logan et al. | |
| 3,922,475 A | 11/1975 | Manasevlt | |
| 3,922,703 A | 11/1975 | Pankove | |
| 4,067,814 A | 1/1978 | Surakka et al. | |
| 4,168,998 A | 9/1979 | Hasegawa et al. | |
| 4,210,976 A | 7/1980 | Apelt et al. | |
| 4,622,083 A | 11/1986 | Shih | |
| 4,727,047 A | 2/1988 | Bozler et al. | |
| 4,837,182 A | 6/1989 | Bozler et al. | |
| 4,846,931 A | 7/1989 | Gmitter et al. | |
| 4,855,249 A | 8/1989 | Akasaki et al. | |
| 4,870,468 A | 9/1989 | Kinoshita et al. | |
| 4,883,561 A | 11/1989 | Gmitter et al. | |
| 4,931,132 A | 6/1990 | Aspnes et al. | |
| 4,985,742 A | 1/1991 | Pankove | |
| 5,006,914 A | 4/1991 | Beetz et al. | |
| 5,030,583 A | 7/1991 | Beetz et al. | |
| 5,146,465 A | 9/1992 | Khan et al. | |
| 5,204,314 A | 4/1993 | Kirlin et al. | |
| 5,239,188 A | 8/1993 | Takeuchi et al. | |
| 5,278,435 A | 1/1994 | Van Hove et al. | |
| 5,334,277 A | 8/1994 | Nakamura | |
| 5,373,171 A | 12/1994 | Imai et al. | |
| 5,385,862 A | 1/1995 | Moustakas | |
| 5,433,169 A | 7/1995 | Nakamura | |
| 5,536,323 A | 7/1996 | Kirlin et al. | |
| 5,563,428 A | 10/1996 | Ek et al. | |
| 5,620,557 A | 4/1997 | Manabe et al. | |
| 5,679,152 A * | 10/1997 | Tischler et al. | 117/97 |
| 5,686,738 A | 11/1997 | Moustakas | |
| 5,770,887 A | 6/1998 | Tadatomo | |
| 5,814,885 A | 9/1998 | Pogge et al. | |
| 5,846,844 A | 12/1998 | Akasaki et al. | |
| 5,858,086 A | 1/1999 | Hunter | |
| 5,909,036 A | 6/1999 | Tanaka et al. | |
| 5,919,305 A | 7/1999 | Solomon | |
| 5,954,874 A | 9/1999 | Hunter | |
| 5,970,080 A | 10/1999 | Hata | |
| 6,071,795 A | 6/2000 | Cheung et al. | |
| 6,136,093 A | 10/2000 | Shiomi et al. | |
| 6,146,457 A | 11/2000 | Solomon | |
| 6,156,581 A | 12/2000 | Vaudo et al. | |
| 6,176,925 B1 | 1/2001 | Solomon et al. | |
| 6,177,292 B1 | 1/2001 | Hong et al. | |
| 6,218,280 B1 | 4/2001 | Kryliouk et al. | |
| 6,261,931 B1 | 7/2001 | Keller et al. | |
| 6,273,948 B1 | 8/2001 | Porowski et al. | |
| 6,280,523 B1 | 8/2001 | Coman et al. | |
| 6,331,208 B1 | 12/2001 | Nishida et al. | |
| 6,420,242 B1 | 7/2002 | Cheung et al. | |
| 6,440,823 B1 | 8/2002 | Vaudo et al. | |
| 6,447,604 B1 | 9/2002 | Flynn et al. | |
| 6,488,767 B1 | 12/2002 | Xu et al. | |
| 6,533,874 B1 | 3/2003 | Vaudo et al. | |
| 6,544,867 B1 | 4/2003 | Webb et al. | |
| 6,559,075 B1 | 5/2003 | Kelley et al. | |
| 6,596,079 B1 | 7/2003 | Vaudo et al. | |
| 6,656,615 B2 | 12/2003 | Dwilinski et al. | |
| 6,692,568 B2 | 2/2004 | Cuomo et al. | |
| 6,765,240 B2 | 7/2004 | Tischler et al. | |
| 6,784,085 B2 | 8/2004 | Cuomo et al. | |
| 6,806,508 B2 | 10/2004 | D'Evelyn et al. | |
| 6,958,093 B2 | 10/2005 | Vaudo et al. | |
| 6,972,051 B2 * | 12/2005 | Tischler et al. | 117/97 |
| 2001/0008656 A1 | 7/2001 | Tischler et al. | |
| 2002/0028314 A1 | 3/2002 | Tischler et al. | |
| 2002/0096692 A1 | 7/2002 | Nakamura et al. | |

FOREIGN PATENT DOCUMENTS

| | | |
|---|---|---|
| EP | 937790 A2 | 8/1999 |
| EP | 1065299 A2 | 1/2001 |
| EP | 0966047 A2 | 11/2005 |
| JP | 52103399 | 8/1977 |
| JP | 56059700 B1 | 5/1981 |
| JP | 62-138399 A1 | 6/1987 |
| JP | 2000-022212 A2 | 1/2000 |

OTHER PUBLICATIONS

Balkas, C.M., et al., Mat. Res. Soc. Symp. Proc., 1997, p. 41, vol. 449.

Baur, J., et al., Photoluminescence of residual transition metal impurities in GaN, Applied Phys. Lett., Aug. 1995, pp. 1140-1142, vol. 67, No. 8.

Baur, J., et al., Infrared luminescence of residual iron deep level acceptors in gallium nitride (GaN) expitaxial layers, Applied Phys. Lett., Feb. 1994, pp. 857-859, vol. 64, No. 7.

Bauer, J., et al., Determination of the GaN/AlN band offset via the (-/0) acceptor level of iron, Applied Phys. Lett., Oct. 1994, pp. 2211-2213, vol. 65, No. 17.

Chi-Kuang, S., et al., Large near resonance third order nonlinearity in GaN, Opt. Quantum Electron., 2000, pp. 619-640, vol. 32, No. 4/5.

Detchprohm, T., et al., Applied Phys. Lett., 1992, p. 2688, vol. 61.

Dryburgh, P.M., The Ninth International Conf. on Cryst. Growth, 1989, vol. ICCG-9.

Dugger, C.O., Mat. Res. Bull., 1974, p. 331, vol. 9.

Elwell, D., et al., Prog. Cryst. Growth & Charact., 1988, pp. 53-78, vol. 17.

Graf, T. et al., The Mn 3+/2+ acceptor level in group III nitrides, Applied Phys. Lett., 2002, pp. 5159-5161, vol. 81, No. 27.

Heikman, S., et al., Growth of Fe doped semi-insulating GaN by metalorganic chemical vapor deposition, Applied Phys. Lett., 2002, pp. 439-441, vol. 81, No. 3.

Heitz, R., et al., Zeeman spectroscopy of the Fe 3+ center in GaN, Applied Phys. Lett., Nov. 1995, pp. 2822-2824, vol. 67, No. 19.

Heitz, R., et al., Excited states of Fe 3+ in GaN, Physical Review B, Feb. 1997, pp. 4382-4387, vol. 55, No. 7.

Iwasaki, H., et al., Applied Phys. Lett., 1992, p. 2636, vol. 63.

Karpinski, J., et al., Equilibrium pressure of N2 over GaN and high pressure solution growth of GaN, J. Cryst. Growth, 1984, vol. 66.

Karpinski, J., et al., High pressure thermondynamics of GaN, J. Cryst. Growth, 1984, pp. 11-20, vol. 66.

Kelley, M.K., et al., Mat. Res. Soc. Symp. Proc., 1998, p. 973, vol. 482.

Kelley, M.K., et al., Optical patterning of GaN films, Applied Phys. Lett., 1996, pp. 1749-1751, vol. 69, No. 12.

Kelley, M.K., et al., Optical process for liftoff of group III-nitride films, Physica Status Solidi, 1997, p. R3, vol. 159.

Korotkov, R.Y., et al., Optical properties of the deep Mn acceptor in GaN:Mn, Applied Phys. Lett., Mar. 2002, pp. 1731-1733, vol. 80, No. 10.

Kuebler, S., et al., Three-dimensional micro-fabrication using two-photon-activated chemistry, Proc. SPIE- Int. Soc. Opt. Eng., 2000, pp. 97-105, vol. 3937.

Kuzentsov, N.I., et al., Insulating GaN:Zn layers grown by hydride vapor phase epitaxy on SiC substrates, Applied Phys. Lett., 1999, pp. 3138-3140, vol. 75, No. 20.

Langer, J., et al., Transition-metal impurities in semiconductor and heterojunction band lineups, Physical Review B, 1988, pp. 7723-7739, vol. 38, No. 11.

Larkin, D.J., et al., Applied Phys. Lett., 1994, p. 1659, vol. 65.

Logan, R.A., et al., J. Electrochem., 1972, p. 1727, vol. 119.

Maruska, H.P., et al., Development of 50 mm diameter non-polar GaN substrates for device application, 2003 International Conference on Indium Phosphide & Related Materials, May 2003, pp. 567-570.

Matsunami, W.S. Yoo, PhD Dissertation, 1991, Publisher: Kyoto University.

Matsuoka, T., Current status of GaN and related compounds as wide-gap semiconductors, J. Crystal Growth, 1992, pp. 433-438, vol. 124.

Melnik, Y., et al., Mat. Res. Soc. Symp. Proc., 1998, p. 269, vol. 482.

Misawa, H., et al., Formation of photonic crystals by femotosecond laser microfabrication, Proc. SPIE—Int. Soc. Opt. Eng., 2000, pp. 29-32, vol. 4088.

Nakamura, S., et al., Japanese Journal of Applied Physics, 1998, p. L309, vol. 37.

Nakamura, S., et al., Japanese Journal of Applied Physics, 1992, p. 2883, vol. 31.

Neogi, A., et al., Intersubband-transition-induced interband two-photon absorption by fremtosecond optical excitation, Proc. SPIE-Int. Soc. Opt. Eng., 2000, pp. 91-97, vol. 3940.

Nickolaev, et al., AlN wafers fabricated by MVPE, Session W6.5, 1999, Publisher: Fall Materials Research Society, Published in: Boston, MA.

Ofuchi, H., et al., Flourescence X-ray absorption fine structure study on local structures areound Fe atoms heavily doped in GaN by low-t . . . , Applied Phys. Lett., 2001, pp. 2470-2472, vol. 78, No. 17.

Pasternak, J., et al., Pys. Stat. Sol., 1964, p. 331, vol. 7 (English Abstract).

Porowski, Sylwester, Bulk and homoepitaxial GaN-growth and characterisation, Journal of Crystal Growth, 1998, pp. 153-158, vol. 189/190.

Porowski, S., et al., Mat. Res. Soc. Symp. Proc, 1997, p. 35, vol. 449.

Sarney, et al., TEM studies of bulk AlN by physical vapor, Session W5.5, 1999, Publisher: Fall Materials Research Society, Published in: Boston, MA.

Schowalter, et al., Preparation and characterization of single crystal aluminum nitride substrates, Materials Research Society, Dec. 1999.

Slack, G.A., et al., J. Cryst. Growth, 1977, pp. 560-563, vol. 42.

Slack, G.A., et al., J. Cryst. Growth, 1976, p. 263, vol. 34.

Strite, S., et al., GaN, AlN, and InN: A review, J. Vac. Sci. Technol., 1992, pp. 1237-1266, vol. B 10, No. 4.

Sukhoveyev, V.A., et al., GaN 20mm diameter ingots grown from melt-solution by seeded technique, Session W6.6, 1999, Publisher: Fall Materials Research Society, Published in: Boston, MA.

Tavernier, P.P., et al., Photoluminescence from laser assisted debonded epitaxial GaN and ZnO files, Applied Phys. Lett., 1999, pp. 2678-2680, vol. 74, No. 18.

Tischler, M., et al., Defect reduction in GaAs epitaxial layers using a GaAsP-InGaAs strained-layer superlattice, Applied Phys. Lett., 1985, pp. 294-296, vol. 46, No. 3.

Vaudo, et al., GaN boule growth: a pathway to GaN wafers with improved material quality, Physica Status Solidi (a), 2002, pp. 494-497.

Wahl, U., et al., Direct evidence for implanted Fe on substitutional Ga sites in GaN, Applied Phys. Lett., May 2001, pp. 3217-3219, vol. 78, No. 21.

Webb, J.B., et al., Semi-insulating C-doped GaN and high-mobility AlGaN/GaN heterostructures grown by ammonia molecular beam epitaxy, Applied Phys. Lett., Aug. 1999, pp. 953-955, vol. 75, No. 7.

Wetzel, C. et al., GaN epitaxial layers grown on 6H-SiC by the sublimation sandwich technique, Applied Phys. Lett., 1994, pp. 1033-1035, vol. 65, No. 8.

Wong, W.S., et al., Damage-free separation of GaN thin films from sapphire substrates, Applied Phys. Lett., 1998, pp. 599-601, vol. 72, No. 5.

Kelly, Michael K., et al., Large Free-Standing GaN Substrates by Hydride Vapor Phase Epitaxy and Laser-Induced Liftoff, Jpn. J. Appl. Phys., Mar. 1, 1999, pp. L217-L219, vol. 38, No. 3A.

\* cited by examiner

BULK SINGLE CRYSTAL GALLIUM NITRIDE AND METHOD OF MAKING SAME

CROSS-REFERENCE TO RELATED APPLICATIONS

This is a continuation of U.S. patent application Ser. No. 09/929,789 filed Aug. 14, 2001 in the names of Michael A. Tischler, Thomas F. Kuech and Robert P. Vaudo for "Bulk Single Crystal Gallium Nitrate and Method of Making Same," issued Dec. 6, 2005 as U.S. Pat. No. 6,972,051, which in turn is a continuation of U.S. patent application Ser. No. 08/955,168, filed Oct. 21, 1997 in the names of Michael A. Tischler, Thomas F. Kuech and Robert P. Vaudo for "Bulk Single Crystal Gallium Nitrate and Method of Making Same," now abandoned, which in turn is a continuation-in-part of U.S. patent application Ser. No. 08/188,469 filed Jan. 27, 1994 in the names of Michael A. Tischler, and Thomas F. Kuech for "Method of Making a Single Crystal Ga*N Article," issued Oct. 21, 1997 as U.S. Pat. No. 5,679,152.

BACKGROUND OF THE INVENTION

1. Field of the Invention

This invention relates to bulk single crystal binary, ternary or quaternary metal nitrides such as gallium nitride, such metal nitrides being referred to broadly hereafter by the symbol M*N, including single crystal M*N substrate articles useful for formation of microelectronic structures thereon, as well as to an appertaining method of forming M*N in single crystal bulk form.

2. Description of the Related Art

The III-V nitrides, in consequence of their electronic and optical properties and heterostructure character, are highly advantageous in the fabrication of a wide range of microelectronic structures. In addition to their wide band gaps, the III-V nitrides also have direct band gaps and are able to form alloys which permit fabrication of well lattice-matched heterostructures. Consequently, devices made from the III-V nitrides can operate at high temperatures, with high power capabilities, and can efficiently emit light in the blue and ultraviolet regions of the electromagnetic spectrum. Devices fabricated from III-V nitrides have applications in full color displays, super-luminescent light-emitting diodes (LEDs), high density optical storage systems, excitation sources for spectroscopic analysis applications, etc. High temperature applications are found in automotive and aeronautical electronics.

To effectively utilize the aforementioned advantages of the III-V nitrides, however, requires that such materials have device quality and a structure accommodating abrupt heterostructure interfaces, viz., III-V nitrides must be of single crystal character, substantially free of defects that are electrically or optically active.

A particularly advantageous III-V nitride is GaN. This nitride species can be utilized in combination with aluminum nitride (AlN) to provide optically efficient, high temperature, wide band gap heterostructure semiconductor systems having a convenient, closely matched heterostructure character similar to that of GaAs/AlAs. Indium nitride may also be added to GaN or AlN to provide additional advantages.

Corresponding advantages are inherent in ternary GaN compositions of the shorthand formula MGaN, wherein M is a metal compatible with Ga and N in the composition MGaN, and the composition MGaN is stable at standard temperature and pressure (25° C. and 1 atmosphere pressure) conditions. Examples of potential M species include Al and In. Such compounds have compositions described by the formula $M_{1-x}Ga_xN$, where x ranges from 0 to 1. The addition of a third compatible metal provides quaternary alloys of general formula $M_{1-x-y}M'_yGa_xN$, where M and M' are compatible metals, in particular Al and In, and x and y range from 0 to 1. Such quaternary alloys are referred to by shorthand formula AlGaInN.

Alloys of GaN, AlN or InN with silicon carbide (SiC) may be advantageous because they can provide modulated band gaps. Such alloys have in the past been difficult to grow in single crystal form.

For ease of reference in the ensuing disclosure, therefore, the term "M*N" is defined as including binary (e.g., GaN), ternary (MGaN), and quaternary (MM'GaN) type gallium nitride type compounds, as well as SiC, SiC/AlN alloys, SiC/GaN alloys, SiClnN alloys, and other related compounds such as alloys of SiC with AlGaN. All possible crystal forms are meant to be included in this shorthand term, including all cubic, hexagonal and rhombohedral modifications and all SiC polytypes. Examples of these compounds include AlN, InN, AlInN, AlGaN, InGaN, and AlInGaN.

For device applications, therefore, it would be highly advantageous to provide substrates of M*N, for epitaxial growth thereon of any of the M*N materials, especially GaN, AlGaN, InGaN, or SiC, for the production of heteroepitaxial devices. Unfortunately, however, it heretofore has not been possible to produce GaN in single crystal bulk form, and for all M*N materials, growth of high quality bulk single crystals has been fraught with difficulty.

It therefore would be a significant advance in the microelectronics art, and is correspondingly an object of the present invention, to provide M*N in bulk single crystal form, suitable for use thereof as a substrate body for the fabrication of microelectronic structures.

It is another object of the present invention to provide an appertaining method for the formation of bulk single crystal M*N which is relatively simple and may be readily achieved using conventional crystal growth techniques in an economic manner.

Other objects and advantages of the invention will be more fully apparent from the ensuing disclosure and appended claims.

SUMMARY OF THE INVENTION

In one aspect, the present invention relates to a method of making a single crystal M*N article, including the steps of:

1. providing a substrate of material having a crystalline surface which is epitaxially compatible with M*N under the conditions of M*N growth;
2. depositing a layer of single crystal M*N over the surface of the substrate; and
3. etchably removing the substrate from the layer of single crystal M*N to yield the layer of single crystal M*N as said single crystal M*N article.

A key point of this invention is that the sacrificial substrate is etched away in situ, while the substrate/M*N structure is preferably at or near the growth temperature.

The sacrificial substrate may for example include a crystalline substrate material such as silicon, silicon carbide, gallium arsenide, sapphire, spinel ($MgAl_2O_4$), MgO, $ScAlMgO_4$, $LiAlO_2$, $LiGaO_2$, ZnO, or a non-crystalline substrate of a material such as graphite, glass, M*N, $SiO_2$, etc., for which a suitable etchant may be employed to remove the sacrificial substrate by etching. In the case of silicon and gallium arsenide, for example, HCl gas may be usefully employed. Additional substrates include silicon-on-insulator (SOI) substrates, compliant substrates of the type disclosed in U.S. Pat. No. 5,563,428 to B. A. Ek et al., and substrates containing buried implant species, such as hydrogen and/or oxygen. As a further alternative for the sacrificial substrate on which the M*N is grown, twist-bonded substrate structures may be used, i.e., where the substrate of crystalline material is bonded to another single crystal substrate material with a finite angular crystallographic misalignment. As yet another alternative, the substrate of crystalline material may be bonded to a suitable material, which preferably can be easily removed or has a similar thermal coefficient of expansion as the M*N.

The layer of single crystal M*N may be deposited directly on the surface of the crystalline or non-crystalline substrate, or alternatively it may be deposited on an uppermost surface of one or more intermediate layers which in turn are deposited on the crystalline substrate. The one or more intermediate layers may serve as a buffer layer to enhance the crystallinity or other characteristics of the M*N layer, as a template for the subsequent M*N growth thereon, or the intermediate layer(s) may serve as protective layer(s), or as an etch stop to prevent the etchant for the sacrificial substrate from etching into the M*N material.

When the substrate material has a protective layer or template layer deposited thereon, such layer is deposited on the substrate prior to growth of the M*N layer on the substrate, but such layer, or other intermediate layer(s), may be formed in situ in the growth chamber prior to initiation of growth of M*N thereon.

The growth of the M*N material may be carried out in a hydride vapor phase epitaxy (HVPE) reactor. As mentioned, a protective layer may be employed to prevent decomposition of the single crystal substrate surface while M*N growth is proceeding. Such protective layer should be of a material favorable for M*N deposition. Examples include materials such as M*N and alloys thereof, wherein the protective layer is of a different material than the main body of the substrate, or is otherwise differently formed on the main body of the substrate, e.g., under different process conditions. The protective layer may be formed by any suitable technique such as for example sputtering, chemical vapor deposition, molecular beam epitaxy (MBE), vapor phase epitaxy (VPE), etc.

In another aspect, the invention utilizes the outdiffusion of specific species from the substrate into the M*N layer to provide enhanced properties of the final M*N product. An example of this aspect is the growth of M*N on a silicon substrate. In this case, Si can be caused to diffuse out of the silicon substrate and into the M*N. This diffusion will form a thin M*N region which is heavily doped with silicon. Silicon-doped M*N is n-type, and this structure is advantageous in certain device structures, as for example for making ohmic contacts to the back surface of the M*N layer or for forming p-n junctions.

In another aspect, the invention may be carried out with a substrate which has been implanted with hydrogen, whereby during the deposition of M*N or thereafter (during an elevated temperature exposure separation step) hydrogen builds pressure in situ in the heated substrate which in turn effects fracture of the substrate from the M*N material, to yield the M*N product article.

In another aspect, the invention relates to bulk single crystal M*N articles, such as are suitable for use as substrates for the fabrication of microelectronic structures thereon. As used herein, the term "bulk single crystal M*N" refers to a body of single polytype crystalline M*N having three dimensional (x,y,z) character wherein each of the dimensions x, y is at least 100 micrometers and the direction z is at least 1 μm. In the preferred practice of the invention, the single crystal M*N product will be of cylindrical or disc-shaped form, with diameter d and thickness z, where d is at least 100 μm and z is at least 1 μm. In a preferred aspect, each of the dimensions d and z is at least 200 micrometers. The bulk single crystal M*N article may most preferably have a thickness dimension z of at least 100 micrometers, and diameter dimension which is at least 2.5 centimeters.

Other aspects, features and embodiments of the invention will be more fully apparent from the ensuing disclosure and appended claims.

DETAILED DESCRIPTION OF THE INVENTION, AND PREFERRED EMBODIMENTS THEREOF

Figure 1:
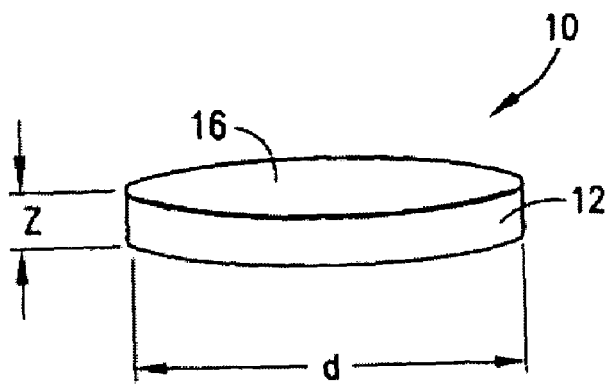
FIG. 1 is a perspective view of a bulk single crystal M*N article according to one aspect of the invention.

The present invention is based on the discovery that single crystal M*N articles of a self-supporting structural character can be readily formed by the deposition of single crystal M*N on a substrate epitaxially compatible with the single crystal M*N, followed by in-situ removal of the sacrificial substrate at the growth temperature. The substrate is removed by etching it away from the single crystal M*N, at the M*N growth temperature or at a temperature in proximity to the growth temperature, to yield the single crystal M*N as a product article.

Since no M*N substrates currently (before the making of the present invention) exist, growth of these compounds must initially take place heteroepitaxially, for example GaN on silicon. Two types of defects arise as a result of heteroepitaxial growth. The first is dislocations due to the lattice mismatch between the M*N layer and the substrate. The typical substrate for GaN is sapphire, which has a 13.8% lattice mismatch to GaN. SiC is a closer lattice match (≈3%), but the mismatch is still quite large. Many other substrates have been used, but all of them have large lattice mismatches and result in a high density of defects in the grown layers.

The second kind of defect is dislocations generated during cool-down after growth as a result of different thermal coefficients of expansion of the substrate and epitaxial layer. In accordance with the present invention, a method for reducing or eliminating the generation of these defects is employed to produce large area, high quality single crystal M*N substrates.

In carrying out the present invention, a sacrificial substrate is employed, upon which is nucleated the M*N layer. The M*N layer is grown on the substrate to the desired thickness and then the substrate is etched away, in-situ, at temperatures close to the growth temperature. Suitable temperatures for the etching step (close to the growth temperature) are desirably within 300° C., and preferably within 100° C., more preferably within 50° C., and most preferably within 25° C. of the temperature at which the M*N layer is grown.

Dislocations arising from the lattice mismatch are reduced in density by growing thick M*N layers. It is known that the misfit dislocation density decreases with epitaxial layer thickness, and in the practice of the present invention, very thick (25-1000 μm) layers can be grown. In fact, if the sacrificial substrate is more easily deformable than M*N and is very thin (extremely thin silicon substrates are commercially available, in thicknesses as thin as 2-5 μm), growth of a thick overlayer of M*N may have the effect of pushing the defects into the sacrificial substrate, leaving a substantially defect-free M*N single crystal product after the etching step. The misfit dislocation density can be further reduced by using buffer layers which may be a single compound layer, a compositionally graded layer structure, or a superlattice structure comprising alternating layers A and B, where A and B are selected from GaN, AlN and InN and alloys of SiC with these nitrides. In general, the strained superlattice can comprise from 5 to 200 alternating A,B monolayers. By using such superlattices, it is possible to force misfit dislocations to the edge of the substrate instead of permitting them to propagate up into the growing layer. Such superlattice buffer layers have been characterized previously (Tischler et al., Applied Physics Letters, 46, p. 294 (1985)).

Dislocations due to the different thermal coefficients of expansion are eliminated in the practice of the present invention by in-situ removal of the substrate at or near the growth temperature. The in-situ removal may be effected by the introduction of halogenated gaseous species (i.e. HCl, HF, etc.) which will etchably remove the sacrificial substrate at temperatures close to the growth temperature.

In one implementation, the M*N growth process may be performed in a two chamber system with the sacrificial substrate separating the two chambers of the system. By way of example, the two chambers may be separated by a carrier member having holes or openings in it which are the same size as the sacrificial substrate. Small tabs or other retention structures may be used on the bottom of the carrier member to hold the substrate in place. The M*N precursors are introduced in one chamber to cause the deposition of the M*N layer. The growth of the M*N layer proceeds both perpendicular as well as parallel to the substrate surface. After several hundred microns of growth, the M*N will extend over the edge of the sacrificial substrate. This overhang may assist in providing a suitable seal between the two chambers. Sealing is further enhanced during the growth process by keeping the pressures in the two chambers substantially equal or slightly lower in the deposition chamber, to minimize diffusion. During or after the growth of the M*N layer and preferably without reducing the temperature, the gaseous etching species are introduced in the other chamber to etchably remove the sacrificial substrate.

Alternatively, an etchant may be chosen which preferentially etches the sacrificial substrate or the M*N layer may be grown to a much greater thickness than the thickness of the sacrificial substrate, so that upon etching, the single crystal M*N product remains. An intermediate etch stop layer may be initially formed on the sacrificial substrate, to prevent the etchant from effecting removal of material other than the sacrificial substrate material.

In one version of this process, the M*N layer is deposited and then the substrate is etchably removed. In another embodiment of this process, M*N deposition and substrate removal are performed simultaneously.

As a result, the sacrificial substrate is removed, leaving the M*N layer sitting in the recess of the carrier member. During the etching sequence, cross-diffusion may be minimized by keeping the pressure in the growth chamber equal to or slightly higher than the pressure in the etching chamber. Finally, the carrier member may be withdrawn to unload the two-chamber system.

It is apparent from the foregoing that such two-chamber system, or other apparatus system for carrying out the present invention, can be scaled up to grow M*N layers on many sacrificial substrates concurrently.

In another embodiment of this process, the growth takes place in a multi-reactor system where first one side of the substrate is exposed to the gas species used for deposition of the desired material. Then the substrate or substrates are transferred to a different chamber where the other side of the substrate is exposed to gas species to etch off the original substrate material.

As another process variation, a substrate which has been implanted with hydrogen, e.g., by ion implantation thereof, may be used for the growth of M*N. During the deposition of M*N or thereafter during an elevated temperature exposure separation step, the implanted hydrogen builds pressure in situ in the heated substrate to cause fracture of the substrate from the M*N material, thereby yielding the M*N product article.

Depending on the desired goals of the growth process, growth of M*N can take place in either the kinetically limited regime or the mass transport limited regime. If growth occurs in a kinetically limited regime, this would permit stacking of the substrates in a furnace for simultaneous uniform M*N deposition on a large number of substrates. In another embodiment, growth could take place in the mass transport limited regime, which would maximize the growth rate and lead to short throughput times.

In a specific embodiment, the sacrificial substrate is silicon and the substrate to be produced is GaN. Growth begins by heating the silicon to the growth temperature (in the range of 800-1300° C.) and introducing the growth precursors for GaN formation. In one preferred method, this growth process involves initial growth of a silicon buffer layer on the silicon substrate to provide a clean nucleation layer for subsequent growth. The supply (flow) of the silicon precursors is then turned off, and the supply (flow) of the GaN precursors is turned on. The GaN layer is grown to the desired thickness (1-1000 μm, preferably 100-300 μm) and the supply (flow) of the GaN precursors is turned off. The etching species is then introduced (for example HCl) and the silicon substrate is etchably removed. Silicon can be etched using HCl over a wide range of temperatures (700-1200° C.). Typical GaN growth temperatures are about 1000-1100° C., and so a temperature regime may be selected that is suitable for both growth and etching. The etching time can be reduced by using pre-thinned sacrificial substrates. The remaining GaN layer is then cooled and removed from the reactor.

The growth of GaN layers or films by vapor phase processes is well-known in the art. GaN may be grown using trimethylgallium and ammonia precursors. This process produces high quality material, but the precursors are expensive and the GaN growth is usually done in a cold-wall reactor, which may complicate heating of the substrate during the etching step. Alternatively, GaN may be grown by a chemical vapor transport method, in which gallium and ammonia are the source materials, and a stream of HCl is passed over the gallium to transport it into the reactor in the form of gallium chloride. This method has the advantage that the sources are somewhat more economical and the process is normally carried out in a hot wall reactor.

It will be understood from the foregoing that in addition to GaN, other M*N species can be grown in a similar fashion. In fact, M*N ternary or quaternary species of precisely specified or of graded composition can be easily produced because the composition is controlled by the gas phase composition during growth. Controlling composition by controlling the ratio of gas phase reactants is much easier than composition control when growth occurs from a liquid melt. Substrates with variations in dopant concentration or in dopant type can also be easily produced. Other materials besides the III-V nitrides could also be grown in this fashion, for example silicon carbide. Some suitable sacrificial substrates for this process include silicon, GaAs and InP.

It is possible that the constituents of the sacrificial substrate may act as a dopant for the desired substrate layer, either by a solid state diffusion process through the interface between the sacrificial substrate and into the M*N layer or by "auto-doping," wherein the some amount of the sacrificial substrate material enters the vapor phase at the growth temperature and dopes the M*N layer as it is growing. If this latter situation is the case, the back side of the sacrificial substrate could be covered with a suitable mask such as silicon dioxide or silicon nitride to prevent autodoping of the grown layer. However, there may be some diffusion of the sacrificial substrate material into the desired grown layer at the interface. This could be beneficial, as for example in the case of a sacrificial silicon substrate and a grown GaN layer, in which the silicon would form a heavily doped n-type layer at the back of the substrate. Such heavily doped n-type layer would be advantageous for forming n-type ohmic contacts. If this layer were not desired, it could be etched or polished off after the growth process had been completed.

The advantages of the method of the present invention are:

1. Large diameter substrates can be produced. The limit is the available size of the sacrificial substrate. For example if the sacrificial substrate is silicon, this could produce substrates greater than 10 inches in diameter.
2. The substrates are essentially ready for subsequent processing after growth. No orienting, coring, flatting, or sawing are required as in bulk growth. Some minor polishing may be required.
3. Many substrates can be produced simultaneously.
4. No defects from thermal coefficient of expansion differences are produced.
5. The defect density can be further reduced by using buffer layers such as a strained layer superlattice.
6. Heavily doped back contact layers for ohmic contacts may be produced.
7. Substrates of varying compositions can be easily produced. For example ternary substrates with pre-selected stoichiometries can be produced easily because the product composition is controlled by the gas phase composition. Such gas phase ratio control is much easier than composition control when growth occurs from a liquid melt. Substrates with compositional variations can also be easily produced, because the gas phase ratio can be varied during growth.
8. The doping density in the substrates can be easily controlled, again by gas phase composition control. No problems associated with segregation coefficient issues are involved. In addition, the doping in the substrate can be varied, if desired, throughout the thickness of the single crystal M*N substrate being prepared.
9. In a potential embodiment, a single crystal M*N substrate and a device structure could be grown in one cycle.

The sacrificial substrate epitaxially compatible with the single crystal M*N may be any suitable crystalline material, on which M*N may be deposited by suitable techniques, such as vapor deposition techniques, including chemical vapor deposition (CVD), chemical vapor transport (CVT), physical vapor deposition (PVD), plasma-assisted CVD, etc. Specific examples include sacrificial substrates of silicon, silicon carbide, gallium arsenide, spinel ($MgAl_2O_4$), MgO, $ScAlMgO_4$, $LiAlO_2$, $LiGaO_2$, ZnO, sapphire, etc., with silicon and silicon carbide being most preferred. Alternative substrates include silicon-on-insulator (SOI) substrates, compliant substrates of the type disclosed in U.S. Pat. No. 5,563,428 to B. A. Ek et al., and substrates containing buried implant species, such as hydrogen and/or oxygen. The sacrificial substrate, on which the M*N is grown, may also comprise a twist-bonded substrate. Non-crystalline materials are potentially useful, e.g., graphite, glass, M*N, $SiO_2$, etc. The substrate may be bonded to a suitable material, which preferably can be easily removed or has a similar thermal coefficient of expansion as the M*N.

While it is typically preferred in the practice of the invention to conduct the etch removal of the sacrificial substrate at a temperature in the close vicinity of the growth temperature (e.g., within 100° C. of the growth temperature), it is possible within the broad scope of the invention to perform the etch removal of the sacrificial substrate from the M*N substrate at a temperature of more than 100° C. above the growth temperature of the M*N material, or alternatively at a temperature of more than 100° C. below the growth temperature of the M*N material. Generally, the etch removal of the sacrificial substrate should be carried out a temperature within 300° C. of the growth temperature.

As mentioned, the M*N material may be doped with one or more suitable dopant species, as may be necessary or desirable for a given end use of the bulk M*N material body (subsequent to its separation from the sacrificial substrate on which it is grown, by etch-away of the sacrificial substrate from the M*N material). The doping may be carried out in any suitable manner during the growth of the M*N material, to yield n-type, p-type or semi-insulating doping. The HVPE process preferably used to grow the M*N on the sacrificial substrate is highly amenable to doping.

Doping is carried out by introduction of the gas phase precursor for the dopant to the growth chamber during the growth of the M*N single crystal layer. The dopant in such method is introduced in the vapor phase and is advantageously controlled by a suitable gas flow controller, e.g., a mass flow controller, needle valve in the dopant precursor feed line, etc. The dopant can be delivered in concentrated form or with a suitable diluting carrier gas. The range of dopant flow can be 0.01 sccm to 10 slm, for example 0.1-100 sccm. The dopant precursor is desirably stable in a hot-wall environment to prevent deposition on the wall surfaces of the system and to ensure transport to the growth surface. Alternatively, the doping may be carried out by ion implantation or other suitable doping methodology, either in situ or ex situ.

N-type doping of the M*N material during growth may be carried out with dopant species, such as Si, Ge,S, and Se. For p-type doping, suitable dopant species include Mg, Zn and Be. For semi-insulating doping, the foregoing dopants may be used, with species such as V and Fe. Semi-insulating doping preferably is carried out with dopant species having a suitably large activation energy, e.g., an activation energy greater than about 25% of the band gap energy for the material being doped.

The dopant flow can be controlled during the growth of the M*N layer to allow co-doping or ramped doping, or any other controlled doping scheme appropriate to the M*N material and its end use. Further, the doping can be controlled at the initiation of the growth to allow improved backside ohmic contacts to the conductive M*N substrate article produced by the process of the invention.

The HVPE process of growth and removal can be carried out at any suitable pressure level, e.g., atmospheric pressure or subatmospheric pressure. Further, a differential pressure of >0.1 torr is advantageously maintained between the etching chamber and the growth chamber in a two-chamber system, to minimize cross-contamination.

For example, extremely good results have been achieved in carrying out the growth process at pressures on the order of 50 torr. In general, it is preferred to carry out the growth process at subatmospheric pressure levels, e.g., a pressure of 1 millitorr to about 1 atmosphere, more preferably from about 1 millitorr to 100 torr, and most preferably from about 1 to about 1000 millitorr.

FIG. 1 is a perspective view of a bulk single crystal M*N article 10 having a generally cylindrical or disc-shaped form, in which the side face 12 defines a diameter d. A top main surface 16 of this article is in spaced relationship to a corresponding bottom main surface (not shown), to define a thickness z therebetween, as measured perpendicularly to the plane of the top main surface 16.

This bulk single crystal M*N has three-dimensional character wherein the diameter is at least 100 micrometers (μm) and the z direction is at least 1 μm. In a preferred aspect, the dimension d is at least 200 μm and the dimension z is at least 100 μm. The bulk single crystal M*N article may suitably have a thickness dimension z of at least 100 micrometers, and a diameter of at least 2.5 centimeters.

Such article 10 may be utilized as a substrate for the formation of microelectronic structure(s) thereon, e.g., on the top main surface 16 thereof. Illustrative microelectronic structure(s) include components or assemblies for devices such as LEDs, lasers, transistors, modulation-doped transistors, with applications in full color displays, high density optical storage systems, excitation sources for spectroscopic analysis applications, etc.

Figure 2:
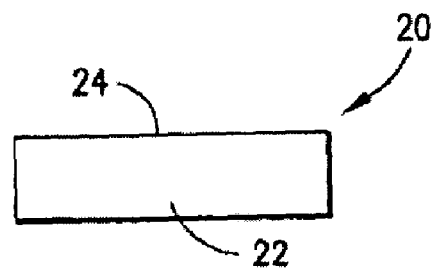
FIG. 2 is a side elevation view of a silicon substrate useful as a supporting base for deposition of single crystal M*N thereon.

FIG. 2 is a side elevation view of a silicon substrate 20 comprising a generally disc-like article 22 which is useful as a supporting base for deposition of single crystal M*N on a top main surface 24 thereof. The silicon substrate may be of any suitable type as regards its structure and method of formation. It will be recognized that the substrate itself may be of suitable material other than silicon, and in general any appropriate material may be employed which is useful for the deposition of M*N thereon. In one embodiment, the substrate 20 may be extremely thin, to minimize the number of defects remaining in the M*N grown layer.

On the top surface 24 of the silicon substrate article 22, M*N is deposited by any suitable deposition technique, such as those illustratively discussed hereinabove. For example, GaN may be deposited by the hydride or chloride techniques. In another embodiment, GaN may be deposited in a nitrogen atmosphere in a chemical vapor deposition reactor, using a suitable organometallic source reagent for the gallium component of the GaN film or layer to be laid down on top surface 24.

Suitable source reagents for the gallium component of the M*N film or layer include gallium and gallium alkyl compounds such as trimethylgallium. In general, the gallium source reagent may comprise any suitable precursor compound or complex which undergoes little decomposition at standard temperature and pressure conditions (25° C., one atmosphere pressure) and which is suitably decomposable at elevated temperature to combine with a suitable nitrogen source to form the GaN layer. It is understood by those familiar in the field that this should be done without formation of by-products which may contaminate or otherwise preclude the efficacy or utility of the deposited M*N film or layer, or which may impair the efficiency of such film or layer. It is also understood by those experienced in the field that other column III elements of the Periodic Table may be added or substituted for the Ga precursor. For example In and Al precursors may be used to form M*N compounds.

The deposition of the M*N layer is performed in a modified system made of conventional crystal growth components as described above.

Figure 3:
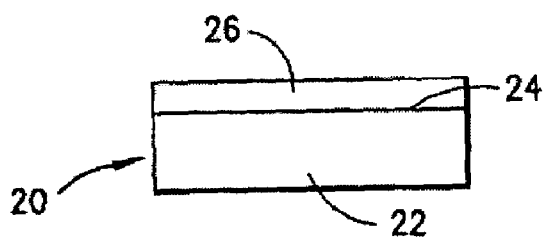
FIG. 3 is a side elevation view of the silicon substrate of FIG. 2, having a layer of single crystal M*N deposited thereon.

FIG. 3 is a side elevation view of the silicon substrate 20 of FIG. 2, having a layer of single crystal M*N 26 deposited on the top surface 24 of the silicon disc-like article 22, by deposition techniques as described hereinabove.

Figure 4:
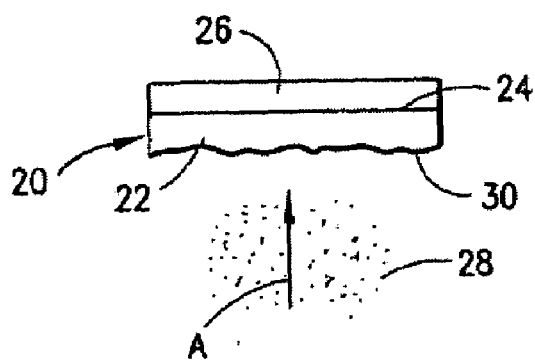
FIG. 4 is a side elevation view of the silicon/M*N structure of FIG. 3, showing the etching action of a silicon etchant on the silicon substrate portion of the structure.

FIG. 4 is a side elevation view of the silicon/M*N structure of FIG. 3, showing the etching action of a silicon etchant on the silicon substrate portion of the structure. For silicon substrates, hydrogen chloride is a gaseous etchant that is etchingly effective at the M*N growth temperature. If the substrate is some material other than silicon, an etchant that is appropriate for that material must be chosen. Hydrogen chloride also may be used to etch gallium arsenide, but silicon carbide and sapphire may require more aggressive etching treatments. Consistent with the process requirements as to purity and low particulate concentrations, the etching process may be assisted by plasma, laser radiation, etc. as may especially be required with the more refractory substrates such as silicon carbide or sapphire.

Figure 5:
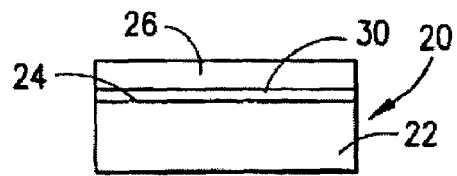
FIG. 5 is a side elevation view of the silicon substrate of FIG. 2, having an intermediate layer of silicon-doped n-type M*N thereon, with an upper layer of single crystal M*N deposited on the top surface of the intermediate layer of silicon-doped n-type M*N.

FIG. 5 is a side elevation view of the silicon substrate of FIG. 2, having an intermediate layer of silicon-doped n-type M*N thereon, with an upper layer of single crystal M*N deposited on the top surface of the intermediate layer of silicon-doped n-type M*N.

The methodology of the present invention may be utilized to form gallium nitride articles of very large size, such as 3 inch diameter wafers or even wafers as large as 18 inches in diameter. The M*N layers deposited on large sacrificial substrates have corresponding dimensions and thus provide substrate bodies of very large size, as suitable for forming a plurality of microelectronic structures on the surface thereof.

Figure 6:
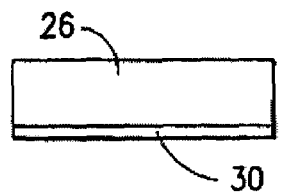
FIG. 6 is a side elevation view of the article of FIG. 5 after removal of the substrate portion thereof, yielding a product article comprising a layer of single crystal M*N having associated therewith a bottom surface layer of silicon-doped n-type M*N.

FIG. 6 is a side elevation view of the article of FIG. 5 after removal of the sacrificial substrate portion thereof, yielding a product article comprising a layer of single crystal M*N 26 having associated therewith on its bottom surface a layer 30 of silicon-doped n-type M*N.

The article shown in FIG. 6 thus may comprise a layer of gallium nitride, having a thickness of for example of 300 micrometers, with a heavily n-type silicon-doped layer on the bottom. This n-type layer is useful for making low resistance ohmic contacts to n-type M*N.

It will be recognized that the description of n-type silicon doped M*N on the bottom of the grown M*N layer is intended for illustrative purposes only, and in practice the dopant may be of suitable material which is epitaxially compatible with the original base or sacrificial substrate layer and the M*N layer and advantageous in the processing or product structure of the M*N articles of the invention.

Alternatively, an interlayer may be employed between the original base and sacrificial substrate layer and the layer of M*N to enhance the crystallinity or other characteristics of the grown M*N layer. This so-called buffer layer is commonly used in heteroepitaxial growth to improve crystal quality. For example, in this case it may comprise a grown layer of silicon on the sacrificial silicon substrate, to improve the surface of the substrate before deposition of the M*N. The buffer layer may comprise one or more strained layers such as a superlattice. As a still further alternative, the interlayer may comprise a release layer or thin film of a coating or material which assists the removal of the M*N layer from the original base or substrate layer. The sacrificial substrate may be of extremely thin thickness, not only to facilitate its subsequent removal by etching, but also to increase the probability that defects generated during M*N growth will end up in the sacrificial substrate layer.

The sacrificial substrate may optionally be provided with a protective intermediate layer deposited thereon prior to growth of the M*N layer, so that the protective layer will prevent decomposition of the single crystal substrate while M*N growth is proceeding. The protective layer may be formed by any suitable technique.

The substrate may also utilize an intermediate layer on the sacrificial substrate that functions in the etch removal of the sacrificial substrate as an etch stop, to prevent etching of the M*N epitaxial layer. Such intermediate layer should be more resistant to etching at the growth temperature than either of the sacrificial substrate material or the bulk growth M*N material, e.g., Si and GaN when Si is the sacrificial substrate material of construction and GaN is the bulk growth material on such substrate. For example, AlN and SiC are potentially useful etch stop layer materials.

Such intermediate layer(s) may be formed in situ during the processing of the sacrificial substrate prior to bulk growth of the M*N material thereon, or ex situ (prior to introduction to the growth chamber for growth of M*N thereon).

Figure 7:
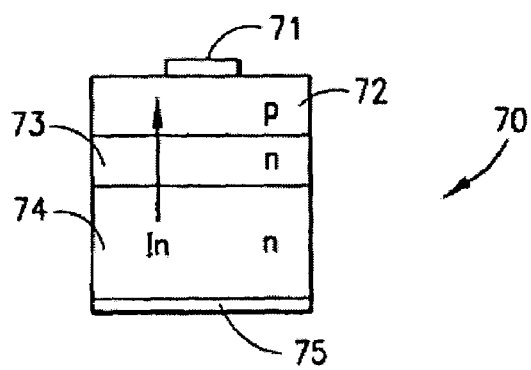
FIG. 7 is a schematic depiction of a light emitting diode device fabricated on a single crystal M*N article according to one aspect of the invention.

FIG. 7 is a schematic depiction of a light emitting diode device 70 fabricated on an n-type single crystal GaN substrate 74 according to one aspect of the invention. In this example, on one surface of the substrate 74 an epitaxial n-type GaN layer 73 is grown, followed by a p-type GaN layer 72. An electrical contact 71 is made to the upper p-type GaN layer, and an electrical contact 75 is made to the GaN substrate. The contacts may be formed of any suitable material known in the art, as for example nickel, gold, germanium or indium. Electron current flows in the n to p direction, and light is emitted in the blue to ultraviolet wavelength region as recombination occurs.

Figure 8:
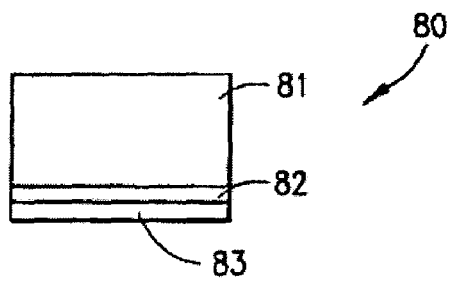
FIG. 8 is a schematic depiction of an ohmic contact structure fabricated on a single crystal M*N article according to one aspect of the invention.

FIG. 8 is a schematic depiction of an ohmic contact structure 80 fabricated on a single crystal GaN article 81 according to one aspect of the invention. Silicon-doped GaN layer 82 is formed by diffusion of silicon out of a sacrificial silicon substrate during the growth of the single crystal GaN article, as described above. After the silicon substrate has been etched away, metal layer 83 is deposited on the silicon-doped GaN layer. The metal layer may be formed of any suitable contacting material known in the art, as for example nickel, gold, germanium or indium, which can provide a low-resistance electrical contact to the GaN substrate via the doped layer.

Figures 9A, 9B, 9C:
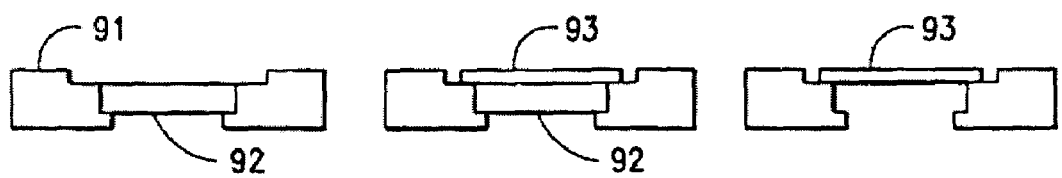
FIG. 9 is a schematic of a wafer carrier suitable for carrying out the process of the present invention, showing (a) the sacrificial substrate at the start of the M*N growth, (b) a M*N layer grown on the sacrificial substrate, and (c) the M*N substrate after removal of the sacrificial substrate.

FIG. 9 is a schematic of a wafer carrier 91 suitable for carrying out the process of the present invention, showing (a) the sacrificial substrate 92 at the start of the M*N growth, (b) a M*N structure 93 grown on the sacrificial substrate, and (c) the M*N structure 93 after removal of the sacrificial substrate. Such a wafer carrier could, for example, be used in a two-chambered reactor system where the wafer carrier separates the two chambers. Small tabs on the bottom of the carrier hold the sacrificial substrate in place, as shown in FIG. 9(a). M*N growth occurs in the top chamber. Growth proceeds both perpendicularly to as well as parallel to the substrate surface. After several hundred microns of growth, the M*N will extend over the edge of the sacrificial substrate, as shown in FIG. 9(b). This overhang helps provide a seal between the two chambers. Sealing is further enhanced during the growth by keeping the pressures in the two chambers approximately equal or slightly lower in the deposition chamber to minimize diffusion. Without allowing the temperature to vary more than 100° C., and preferably less than 25° C., the etchant species is introduced into the lower chamber. The sacrificial substrate is etched away, leaving the M*N layer sitting in the recess of the carrier as shown in FIG. 9(c). During the etching sequence, cross-diffusion is minimized by keeping the pressure in the upper chamber equal to or slightly higher than the pressure in the lower chamber. Upon completion of etching and cool down, the carrier can then be withdrawn from the reactor to unload the system. It is clear that this type of system can be scaled up to process many sacrificial substrates simultaneously.

As mentioned above, the M*N bulk crystal material of the invention contemplates binary as well as ternary and quaternary III-V nitride compounds, silicon carbide, and all possible crystal forms, including all cubic, hexagonal and rhombohedral modifications, and all SiC polytypes, within the scope hereof. Compositionally graded ternary and quaternary compounds such as AlGaN or AlGaInN are also envisioned, as are M*N materials in which the dopant concentration is varied.

While the invention has been described with regard to specific embodiments, structure and features, it will be recognized that the invention may be modified or otherwise adapted to a specific end use application, and all variations, modifications, and embodiments of the invention as claimed are to be regarded as being within the spirit and scope of the invention.

What is claimed is:

1. A method of making a free-standing III-V nitride single crystal article, comprising:

growing single crystal III-V nitride material, on and across a surface of a heterogeneous substrate having a diameter or corresponding dimension in an x,y plane of the surface that is at least 2.5 centimeters, to a thickness of at least 100 micrometers, by a vapor deposition process conducted at elevated growth temperature; and removing the heterogeneous substrate from the single crystal III-V nitride material grown to said thickness, while the single crystal III-V nitride material is at temperature within 300° C. of said elevated growth temperature and prior to cooling of said single crystal III-V nitride material to temperature more than 300° C. below said elevated growth temperature, to yield a free-standing III-V nitride single crystal article having a diameter or corresponding dimension in an x,y plane that is at least 2.5 centimeters, and is at least 100 micrometers in thickness.

2. The method of claim 1, wherein the single crystal III-V nitride material is grown to a thickness that is substantially greater than thickness of said heterogeneous substrate.

3. The method of claim 1, wherein said elevated growth temperature comprises temperature in a range of 800 to 1300° C.

4. The method of claim 1, wherein the free-standing III-V nitride single crystal article has a diameter or corresponding dimension in an x,y plane that is greater than 10 inches.

5. The method of claim 1, wherein the vapor deposition process is conducted at subatmospheric pressure.

6. The method of claim 1, wherein the subatmospheric pressure is in a range of from 1 millitorr to about 1 atmosphere.

7. The method of claim 1, wherein the subatmospheric pressure is in a range of from 1 millitorr to about 100 torr.

8. The method of claim 1, wherein the subatmospheric pressure is in a range of from 1 millitorr to about 1000 millitorr.

9. The method of claim 1, further comprising fabricating a microelectronic structure on the free-standing III-V nitride single crystal article.

10. The method of claim 1, wherein said III-V nitride is gallium nitride.

11. The method of claim 10, wherein said free-standing III-V nitride single crystal article has a diameter or corresponding dimension in an x,y plane that is in a range of from 3 inches to 18 inches.

12. The method of claim 1, wherein the heterogeneous substrate comprises material selected from the group consisting of silicon, silicon carbide, gallium arsenide, sapphire, magnesium aluminate, magnesium oxide, scandium aluminum magnesiate, lithium aluminate, lithium gallate, zinc oxide, graphite, glass, metal nitride, and silicon dioxide.

13. The method of claim 1, wherein the heterogeneous substrate comprises a substrate selected from the group consisting of silicon-on-insulator substrates, compliant substrates, substrates containing implant species, and twist-bonded substrates.

14. The method of claim 1, wherein the heterogeneous substrate is positioned between a growth chamber adapted to carry out said growing, and a removal chamber adapted to carry out said removing, and wherein said growing is conducted for sufficient time to grow said single crystal III-V nitride material over edges of the surface of said heterogeneous substrate to enhance sealing between the growth chamber and the removal chamber.

15. The method of claim 14, wherein pressure in the growth chamber is equal to or less than pressure in the removal chamber during said growing.

16. The method of claim 15, wherein pressure in the growth chamber is equal to or greater than pressure in the removal chamber during said removing.

17. The method of claim 1, wherein said removing comprises chemical action on the heterogeneous substrate.

18. The method of claim 17, wherein said chemical action comprises use of hydrogen chloride or hydrogen fluoride.

19. The method of claim 1, wherein said growing is carried out with diffusion of species from the heterogeneous substrate into the III-V nitride material for doping thereof.

20. The method of claim 19, wherein the heterogeneous substrate comprises silicon, and the III-V nitride single crystal article is silicon-doped.

21. The method of claim 1, wherein the heterogeneous substrate contains implanted hydrogen, and said removing includes fracturing the substrate from the III-V nitride material by in situ pressure building at elevated temperature in the heterogeneous substrate.

22. The method of claim 21, wherein said fracturing is conducted during said growing of single crystal III-V nitride material on the heterogeneous substrate.

23. The method of claim 21, wherein said fracturing is conducted after said growing of single crystal III-V nitride material on the heterogeneous substrate.

24. The method of claim 1, further comprising doping of the single crystal III-V nitride material during said growing.

25. The method of claim 24, wherein said doping comprises doping with at least one dopant species selected from the group consisting of Si, Ge, S, Se, Mg, Zn, Be, V and Fe.

26. The method of claim 1, further comprising fabricating a light emitting diode on said free-standing III-V nitride single crystal article.

27. The method of claim 14, wherein the heterogeneous substrate is disposed in a wafer carrier between the growth chamber and the removal chamber.

28. The method of claim 27, wherein said removing comprises exposure of the heterogeneous substrate to a halogen-containing gas in the removal chamber.

29. The method of claim 1, wherein the III-V nitride material comprises GaN and the heterogeneous substrate comprises sapphire.

30. The method of claim 1, comprising removing the heterogeneous substrate from the single crystal III-V nitride material grown to said thickness, while the single crystal III-V nitride material is at temperature within 100° C. of said elevated growth temperature and prior to cooling of said single crystal III-V nitride material to temperature more than 100° C. below said elevated growth temperature.

31. The method of claim 1, comprising removing the heterogeneous substrate from the single crystal III-V nitride material grown to said thickness, while the single crystal III-V nitride material is at temperature within 50° C. of said elevated growth temperature and prior to cooling of said single crystal III-V nitride material to temperature more than 50° C. below said elevated growth temperature.

32. The method of claim 1, comprising removing the heterogeneous substrate from the single crystal III-V nitride material grown to said thickness, while the single crystal III-V nitride material is at temperature within 25° C. of said elevated growth temperature and prior to cooling of said single crystal III-V nitride material to temperature more than 25° C. below said elevated growth temperature.

33. The method of claim 1, wherein said removing comprises use of plasma.

34. The method of claim 1, wherein said removing comprises use of laser radiation.

* * * * *

UNITED STATES PATENT AND TRADEMARK OFFICE
CERTIFICATE OF CORRECTION

PATENT NO. : 7,332,031 B2  Page 1 of 1
APPLICATION NO. : 11/243768
DATED : February 19, 2008
INVENTOR(S) : Michael A. Tischler It is certified that error appears in the above-identified patent and that said Letters Patent is hereby corrected as shown below:

On the title page, item [56]:

Page 2, References Cited, Other Publications, fourth entry, "Bauer" should be -- Baur --.

Signed and Sealed this

Seventeenth Day of June, 2008

JON W. DUDAS
*Director of the United States Patent and Trademark Office*